US012800645B2

(12) United States Patent
Rodriguez et al.

(10) Patent No.: US 12,800,645 B2
(45) Date of Patent: Nov. 17, 2026

(54) CALIBRATION DEVICE, SETUP, AND METHOD FOR MEASURING A RADIO FREQUENCY SIGNAL GENERATOR

(71) Applicant: Rohde & Schwarz GmbH & Co. KG, Munich (DE)

(72) Inventors: Pedro Rodriguez, Krefeld (DE); Nenad Stojakovic, Essen (DE); Johannes Schoeller, Stephanskirchen (DE); Harald Doppke, Muelheim an der Ruhr (DE); Joerg Nagel, Munich (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 351 days.

(21) Appl. No.: 18/604,661

(22) Filed: Mar. 14, 2024

(65) Prior Publication Data

US 2024/0426957 A1 Dec. 26, 2024

(30) Foreign Application Priority Data

Jun. 20, 2023 (EP) .................................... 23180200

(51) Int. Cl.

| | |
|---|---|
| ***G01R 31/28*** | (2006.01) |
| ***G01R 23/04*** | (2006.01) |
| ***G01R 29/08*** | (2006.01) |
| ***G01R 35/00*** | (2006.01) |

(52) U.S. Cl.

CPC ......... *G01R 31/2822* (2013.01); *G01R 23/04* (2013.01); *G01R 29/0864* (2013.01); *G01R 31/2839* (2013.01); *G01R 31/2841* (2013.01); *G01R 35/005* (2013.01)

(58) Field of Classification Search

CPC .............. G01R 35/005; G01R 29/0864; G01R 31/2822; G01R 23/04; G01R 31/2839; G01R 31/2841; H03D 7/14

See application file for complete search history.

(56) References Cited

U.S. PATENT DOCUMENTS

| | | | | |
|---|---|---|---|---|
| 7,027,792 | B1 | 4/2006 | Luff et al. | |
| 11,346,869 | B2 * | 5/2022 | Schoeller | G01R 31/2822 |
| 2004/0142674 | A1 * | 7/2004 | Kuiri | H04B 1/30 455/313 |

(Continued)

OTHER PUBLICATIONS

Extended European Search Report issued in EP 23 180 200.0-1001 by the European Patent Office on Nov. 29, 2023.

*Primary Examiner* — Amy He

(74) *Attorney, Agent, or Firm* — Studebaker Brackett PLLC

(57) ABSTRACT

The present disclosure relates to a calibration device, a calibration setup, and a calibration method for measuring a radio frequency (RF) signal generator. The calibration device comprises an input configured to receive an RF signal of the RF signal generator, wherein the RF signal is output for the purpose of calibration and has discrete frequency lines. The calibration device further comprises a mixer configured to mix the RF signal with a first local oscillator (LO) signal and a second LO signal. The mixing may comprise a logical AND combination of the RF and LO signals, and obtains an intermediated frequency (IF) signal. The IF signal has discrete frequency lines and has a smaller bandwidth than the RF signal.

21 Claims, 9 Drawing Sheets

(56) References Cited

U.S. PATENT DOCUMENTS

| | | | |
|---|---|---|---|
| 2006/0003727 | A1 | 1/2006 | Litwin et al. |
| 2010/0105350 | A1 | 4/2010 | Baltus |
| 2022/0128608 | A1 | 4/2022 | Schoeller |

* cited by examiner

CALIBRATION DEVICE, SETUP, AND METHOD FOR MEASURING A RADIO FREQUENCY SIGNAL GENERATOR

TECHNICAL FIELD

The present disclosure relates to a calibration device, a calibration setup, and a calibration method for measuring a radio frequency (RF) signal generator.

BACKGROUND

A calibration setup for measuring and subsequently calibrating a signal generator is generally known. During a normal mode operation, the signal generator may output an arbitrary RF signal. In a calibration mode, the signal generator may output an RF calibration signal that is established, for example, based on a comb signal. A comb signal according to this disclosure comprises a series of (substantially) Dirac delta functions that are spaced from each other, for instance, spaced at certain time intervals in time domain or spaced at certain frequency spacings in frequency domain.

The known calibration setup typically comprises a narrowband measuring receiver, which receives the RF calibration signal of the signal generator to be measured and calibrated. The narrowband measuring receiver may comprise an analog-to-digital converter (ADC) with a low bandwidth, wherein the ADC is used to analyze the RF calibration signal. Since the measuring receiver is narrowband, the RF calibration signal of the signal generator typically has to be measured in an iterative manner, i.e., several segments of the RF calibration signal have to be measured subsequently. This segmentation of the RF calibration signal may result in propagating errors, which limit the overall measurement accuracy.

SUMMARY

The present disclosure and its solutions are based further on the following considerations.

An exemplary calibration setup that addresses the issues mentioned above uses a mixer that mixes the RF calibration signal with a comb signal, wherein the comb signal is provided by a pulse generator, in order to produce an intermediate frequency (IF) signal with a reduced bandwidth compared to the RF calibration signal. This allows a narrowband measuring receiver including, for instance, an ADC with a low bandwidth, to process the entire RF calibration signal at once and to avoid the above-described segmentation of the RF calibration signal. The spectrum of the RF calibration signal is effectively compressed in bandwidth, and may be conveniently sampled as the IF signal with compressed bandwidth. This may avoid problems with short-term stability, temperature drift, and propagation errors.

However, the mixer of the exemplary calibration setup shows, for example, a considerable power consumption and significant RF-to-IF signal leakage.

Therefore, an objective of this disclosure is to provide an improved way of measuring and calibrating an RF signal generator. For example, it is an objective to provide a calibration device for a calibration setup, which is able to reduce the bandwidth of an RF signal, which is output by the RF signal generator for the purpose of calibration, to that of an IF signal—so as to enable a narrowband measuring receiver and/or ADC with low bandwidth to process the entire information contained in the output RF signal at once—while at the same time reducing the power consumption and suppressing RF-to IF signal leakage.

These and other objectives are achieved by the solutions of this disclosure provided in the independent claims. Advantageous implementations of are described in the dependent claims.

A first aspect of this disclosure provides a calibration device for measuring a radio frequency (RF) signal generator, the calibration device comprising an input configured to receive an RF signal of the RF signal generator, wherein the RF signal has discrete frequency lines; a pulse generator configured to generate a first local oscillator (LO) signal and a second LO signal; and a mixer configured to mix the RF signal with the first LO signal and the second LO signal, thereby obtaining an IF signal that has discrete frequency lines and a smaller bandwidth than the RF signal.

For instance, the signal generator may be an IQ modulator for generating the RF signal. The above-considered RF signal, which is received by the calibration device, is a RF calibration signal output by the signal generator for the purpose of calibration. The RF signal of the RF signal generator may be used further to test or calibrate a device under test (DUT). The RF signal may be outputted in a calibration mode of the signal generator. The RF signal used for calibration may be received by the calibration device with or without a DUT connected to the RF signal generator. The RF signal may be a multi-carrier continuous wave (MCCW) signal, or may be a MCCW signal with one or more missing frequency lines, or may a combination of any arbitrary RF signal overlaid with a MCCW signal.

The calibration device may be part of a measurement receiver, which is used for measuring and optionally analyzing the RF signal. For instance, the measurement receiver may further comprises an ADC configured to process the IF signal produced by the calibration device. The ADC may have a low bandwidth, which may be matched to the bandwidth of the IF signal. The measurement receiver may be connected to an IQ modulator acting as the signal generator.

Mixing the RF signal with the first LO signal and the second LO signal may be equivalent to mixing the RF signal with a comb signal, which has a comb shifted slightly with respect to the frequency lines of the RF signal, thus resulting in the mixed IF signal. The spectrum of the RF signal may effectively be compressed in bandwidth by the mixing, and may be conveniently processed by the measurement receiver as the lower bandwidth IF signal, e.g., by the ADC of low bandwidth. The ADC may process the entire IF signal at once without requiring segmentation of the RF signal. This may avoid problems with short-term stability, temperature drift, and propagation errors.

Further, the calibration device of the first aspect, due to mixing the first and second LO signal with the RF signal, has additional advantages. For instance, a power consumption of the mixer may be lower than of a conventionally used Gilbert cell mixer. Further, a temperature stability of the mixer may be increased compared to the conventionally used Gilbert cell mixer. The mixer may also show better noise figures.

In an implementation of the calibration device, the mixing of the RF signal with the first LO signal and the second LO signal comprises a logical AND combination of the RF signal, the first LO signal, and the second LO signal.

The mixer may accordingly process the received LO and RF signals by a circuit designed as an AND gate.

In an implementation form of the calibration device, the second LO signal is a negative and time-delayed copy of the first LO signal.

This provides an easy way to produce the first LO signal and the second LO signal, for instance, based on a single LO of the pulse generator. The delay of the second LO signal compared to the first LO signal may be adjusted as needed.

In an implementation of the calibration device, the first LO signal and the second LO signal are selected such that a logical AND combination of the first LO signal and the second LO signal results in a comb signal; wherein the comb signal has a higher bandwidth than the RF signal; wherein the comb signal has equidistant discrete frequency lines; and wherein each of the equidistant discrete frequency lines of the comb signal is different to the discrete frequency lines of the RF signal with regard to frequency.

This allows compressing the bandwidth of the RF signal to the bandwidth of the IF signal, and to process the IF signal (which includes all the information of the RF signal) without segmentation in one go.

The number of lines of the comb signal can be adaptively adjusted to the respective RF signal to be measured, for instance, by adjusting the LO signals and their delay. For example, if only the signal generator is to be measured, the number of lines can be selected smaller. If the DUT is also to be measured, when connected to the signal generator, more lines may be necessary for the measurement, in order to clearly sample the modulation bandwidth. Further, the measurement speed is scalable by changing line count and line accuracy. Equidistant distances between lines may further allow efficient fast Fourier transformation (FFT) processing.

In an implementation form of the calibration device, the pulse generator and the mixer are integrated.

For instance, the pulse generator may be integrated on the same board or chip as the mixer. This may lead to a calibration device or calibration setup with a reduced size and less power consumption. The mixer and pulse generator may also be integrated with other components on the same block or chip-like amplifiers, frequency dividers, and/or hold gates—to reduce the footprint.

In an implementation form of the calibration device, the mixer comprises: a first stage of transistors adapted to receive the RF signal as input; a second stage of transistors connected to the first stage and adapted to receive the second LO signal as input; and a third stage of transistors connected to the second stage and adapted to receive the first LO signal as input.

The exemplary mixer has several advantages over a conventional Gilbert cell mixer, for instance, a lower power consumption and a better noise figure, which may reduce the measurement time.

In an implementation form of the calibration device, the first stage comprises a first transistor pair connected to a current source, wherein the first transistor pair is controlled by the RF signal and is configured to provide a modulated current, which is modulated by the RF signal, to the second stage.

In an implementation form of the calibration device, the second stage comprises a second transistor pair and a third transistor pair, which are each connected to the first transistor pair and are controlled by the second LO signal; the third stage comprises a fourth transistor pair and a fifth transistor pair, which are connected to the second transistor pair and the third transistor pair, respectively; and the second and third stage are configured to mix the modulated current, which is provided by the first stage, with the second LO signal and the first LO signal, thereby providing a pulse-modulated current as the IF signal to an output of the mixer.

Notably, the transistors in the different stages of the mixer may either be bipolar transistors or field effect transistors, e.g., MOSFETs. The pulse-modulated current may be in the order of 100 MHz, however, it is not limited to this bandwidth. If required, the bandwidth of the pulse-modulated current may be higher.

In an implementation form of the calibration device, the first transistor pair comprises a first transistor and a second transistor, wherein opposite phases of the RF signal are connected to control terminals of the first transistor and the second transistor, respectively; wherein input terminals of the first transistor and the second transistor are connected to each other and to the current source; and wherein output terminals of the first transistor and the second transistor are connected to the second stage.

In an implementation form of the calibration device, the second transistor pair comprises a third transistor and a fourth transistor connected by their input terminals, wherein opposite phases of the second LO signal are connected to control terminals of the third transistor and the fourth transistor, respectively; and the third transistor pair comprises a fifth transistor and a sixth transistor connected by their input terminals, wherein opposite phases of the second LO signal are connected to control terminals of the fifth transistor and the sixth transistor, respectively, wherein the input terminals of the third, fourth, fifth, and sixth transistor are connected to the first stage; wherein output terminals of the third transistor and the sixth transistor are connected to the third stage; and wherein output terminals of the fourth transistor and the fifth transistor are connected to a first supply voltage.

In an implementation form of the calibration device, the fourth transistor pair comprises a seventh transistor and an eighth transistor connected by their input terminals, wherein opposite phases of the first LO signal are connected to control terminals of the seventh transistor and the eighth transistor, respectively; and the fifth transistor pair comprises a ninth transistor and the tenth transistor connected by their input terminals, wherein opposite phases of the first LO signal are connected to control terminals of the ninth transistor and the tenth transistor, respectively, wherein input terminals of the seventh, eighth, ninth, and tenth transistor are connected to the second stage; wherein output terminals of the seventh transistor and the tenth transistor are connected to the output of the mixer; and wherein output terminals of the eighth transistor and the ninth transistor are connected to a second supply voltage.

The mixer of the above implementations allows reducing the power consumption by up to hundreds of mW in comparison with a combination of a comb generator and a conventional Gilbert cell mixer. The mixer of the above-implementation may provide the functionality of both these blocks, thus reducing the power consumption by up to several hundreds of mW. Moreover, the noise figure is reduced and the RF-to-IF leakage is cancelled.

In an implementation form of the calibration device, the third stage comprises a sixth transistor pair comprising an eleventh transistor and a twelfth transistor connected by their control terminals; wherein the control terminals of the eleventh transistor and the twelfth transistor are connected to the first supply voltage; wherein output terminals of the eleventh transistor and the twelfth transistor are connected to the second supply voltage; and wherein input terminals of the eleventh transistor and the twelfth transistor are connected to the output terminals of the fourth transistor and the fifth transistor, respectively.

The mixer of this implementation introduces asymmetry into the current flows. The mixer thus shows a reduced temperature difference between the individual transistors during operation. A maximum of 20° C. temperature difference between the transistors in different stages or pairs of the mixer may be achieved, and only an 11° C. temperature difference between transistors in the same pair is possible. In comparison with the topology of a conventional Gilbert-cell mixer, the maximum time that one transistors of the mixer of this implementation is active, is only 50% of the entire time, while in the conventional Gilbert-cell mixer, one of the transistors in the pair is on almost 100% of the entire time. Therefore the temperature symmetry is better in the calibration device of this disclosure.

In an implementation form, the calibration device further comprises a hold gate connected to the output of the mixer, wherein the hold gate is configured to convert a current pulse of the IF signal provided by the mixer to a voltage and to hold the voltage until the next current pulse of the IF signal is output by the mixer, thereby outputting a modulated voltage as an integrated IF signal.

The hold gate may amplify the IF signal by more than 40 dB without the need of an active amplifier. The higher output power may lead to a lower measurement time, so that also an overall calibration of the signal generator may be faster. The amplification does not lead to additional noise, and is very robust.

In an implementation form, the calibration device further comprises a low noise amplifier configured to amplify the RF signal before providing it to the mixer.

This leads to an improved mixing of the RF signal with the LO signals, as the RF signal is amplified without introducing much noise.

In an implementation form, the calibration device further comprises a first frequency divider configured to receive a first clock signal, to convert the first clock signal into a second clock signal, and to provide the second clock signal to the pulse generator; wherein the pulse generator is configured to generate the first LO signal and the second LO signal based on the second clock signal.

The first clock signal may be of higher frequency for obtaining a precise timing. The first frequency divider may be an on-chip divider (e.g., and N divider, N being an integer or zero), and enables a lower frequency second clock signal with sharp edges, so that the precise timing is preserved. The lower frequency second clock signal is beneficial for correct and/or accurate phase detection, and provides additional flexibility in the choice of the LO frequency. As an example, the first frequency divider may be configured to convert 16 GHz to 125 MHz.

The frequency of the first clock signal and/or of the second clock signal may be adaptable, for instance, to adapt it to the system requirements. For instance, the first clock signal may be a sinus signal with 50% duty cycle, and from the sinus signal a pulse shaped second clock signal is generated which serves the LO for producing the LO signals. Accordingly, the second clock signal may have a rectangular shape.

In an implementation form of the calibration device, the hold gate comprises a capacitor connected to the output of the mixer (with one capacitor plate) and to a supply voltage (with the other capacitor plate), respectively, and comprises a switch connected in parallel to the capacitor; wherein the switch is controlled by the second clock signal.

In an implementation form, the calibration device further comprises a second frequency divider, wherein the first frequency divider is further configured to provide the second clock signal to the second frequency divider; wherein the second frequency divider is configured to convert the second clock signal into a third clock signal; and wherein the calibration device is further configured to add the third clock signal provided by the second frequency divider to the IF signal provided by the mixer or to the integrated IF signal provided by the hold gate, thereby obtaining a modified IF signal.

The frequency dividers enable a flexible selection of RF frequencies. Further, the second frequency divider is used, since a starting phase of the first frequency divider may is unknown (common problem for not synchronized dividers). To solve this, the second clock signal output from the first frequency divider is further divided by the second frequency divider, and the output third clock signal from the second frequency divider is added to the down-converted IF signal, so that the third clock signal may be sampled together with the down-converted IF signal in following processing stages as the modified IF signal. The second frequency divider may continuously deliver a divided signal.

In an implementation form, the calibration device is further configured to sample the modified IF signal to reconstruct a phase of the second clock signal provided by the first frequency divider.

The third clock signal may thus act as pilot tones for reconstructing the phase of the second clock signal. Thus, the second frequency divider (e.g., an M divider, wherein M is an integer or zero, and wherein MN) can be used to restore the absolute phase relation of the second clock signal.

In an implementation form, the calibration device further comprises a clock output configured to output the third clock signal provided by the second frequency divider.

The additional output enables flexible clocking of digital circuitry such as field programmable gate arrays (FPGA) or ADC, to which the calibration device provides the (modified) IF signal.

A second aspect of this disclosure provides a calibration setup comprising the calibration device according to the first aspect or any one of its implementations, and the signal generator configured to output the RF signal to a DUT.

The calibration setup can be used to calibrate the DUT, wherein the calibration device may also be used to calibrate the signal generator.

A third aspect of this disclosure provides a method for measuring a RF signal generator, the method comprising receiving an RF signal of the RF signal generator, wherein the RF signal has discrete frequency lines; and mixing the RF signal with a first LO signal and a second LO signal, thereby obtaining an IF signal that has discrete frequency lines and a smaller bandwidth than the RF signal.

The method of the third aspect achieves the same advantages as the device of the first aspect, and may be extended by respective implementations as described above for the calibration device of the first aspect.

For example, in order to run a calibration of the RF signal generator, the RF signal is generated by the RF signal generator. There may be a number of tones in the spectrum of the RF signal, and each of these tones may have a unique distance to a corresponding spectral lines of the LO signals, particularly, to the spectral lines of the AND combination of the first and second LO signal. For each RF tone the arising IF spectrum of the IF signal (or integrated IF signal) has a corresponding line, whose phase and amplitude is directly coupled to the RF tone. An initial calibration measurement of the RF signal generator may reduce the phase and amplitude error of the path between the RF signal generator and the calibration device.

The calibration device of the present disclosure may be able to obtain a high bandwidth RF signal input of up to 54 GHz. A power dissipation of the calibration device may be lower than 2.4 W.

A fourth aspect of this disclosure provides a computer program comprising instructions which, when the computer program is executed by a processor, for example by a processor of the calibration device, cause the processor to perform the method according to the third aspect.

BRIEF DESCRIPTION OF THE DRAWINGS

The above described aspects and implementations are explained in the following description of embodiments with respect to the enclosed drawings.

DETAILED DESCRIPTION OF EXEMPLARY EMBODIMENTS

Figure 1:
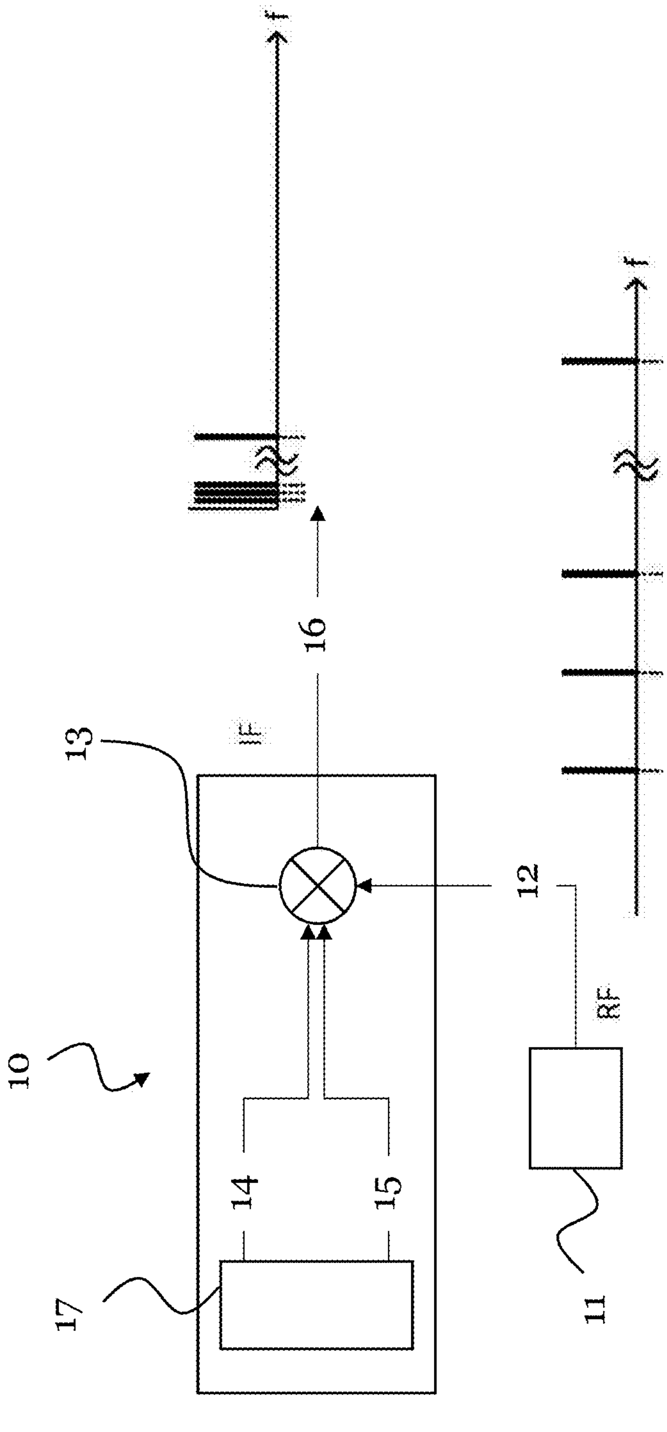
FIG. 1 shows a calibration device according to this disclosure.

FIG. 1 shows a calibration device 10 according to this disclosure. The calibration device 10 may be used to measure a RF signal generator 11. Together with the RF signal generator 11, the calibration device 10 may form a calibration setup, which may be used to calibrate a DUT.

The calibration device 10 comprises an input configured to receive an RF signal 12 of the RF signal generator 11, wherein the RF signal 12 has discrete frequency lines, for instance, may be established based on a comb signal. The RF signal frequency lines may be referred to as tones. This RF signal 12 may be referred to as RF calibration signal 12 in this disclosure, since it is output for the purpose of calibration, for example, in a calibration mode of the RF signal generator 11. The RF signal 12 may be a MCCW signal. The input of the calibration device 10 may be connected to an output of the RF signal generator 11 or to an input of the DUT (which is again connected to the RF signal generator 11) to obtain the RF signal 12.

The calibration device 10 further comprises a pulse generator 17, which is configured to generate a first LO signal 14 and a second LO signal 15, and to provide the first and the second LO signal 14, 15 to the mixer 13. The first and the second LO signal 14, 15 may be produced by a single clock signal (CLK) of the pulse generator 17, e.g., by deriving one LO signal from the other.

The calibration device 10 further comprises a mixer 13, which is configured to mix the RF signal 12 with the first LO signal 14 and the second LO signal 15, thereby obtaining an IF signal 16, which has discrete frequency lines and a smaller bandwidth than the RF signal 12. Accordingly, the RF signal 12 is down-converted or bandwidth compressed to the IF signal 16. Thus, the IF signal 16, or derivations of the IF signal 16 obtained by further processing the IF signal 16, having a bandwidth that allows measuring or analyzing without segmentation of the RF signal 12 or IF signal 16. The IF signal frequency lines may be referred to as tones, and each tone of the IF signal 16 may correspond to one of the frequency lines of the RF signal 12. The mixer 13 may logically combine the LO signals 14, 15 and the RF signal 12 to produce the IF signal 16.

Figure 2:
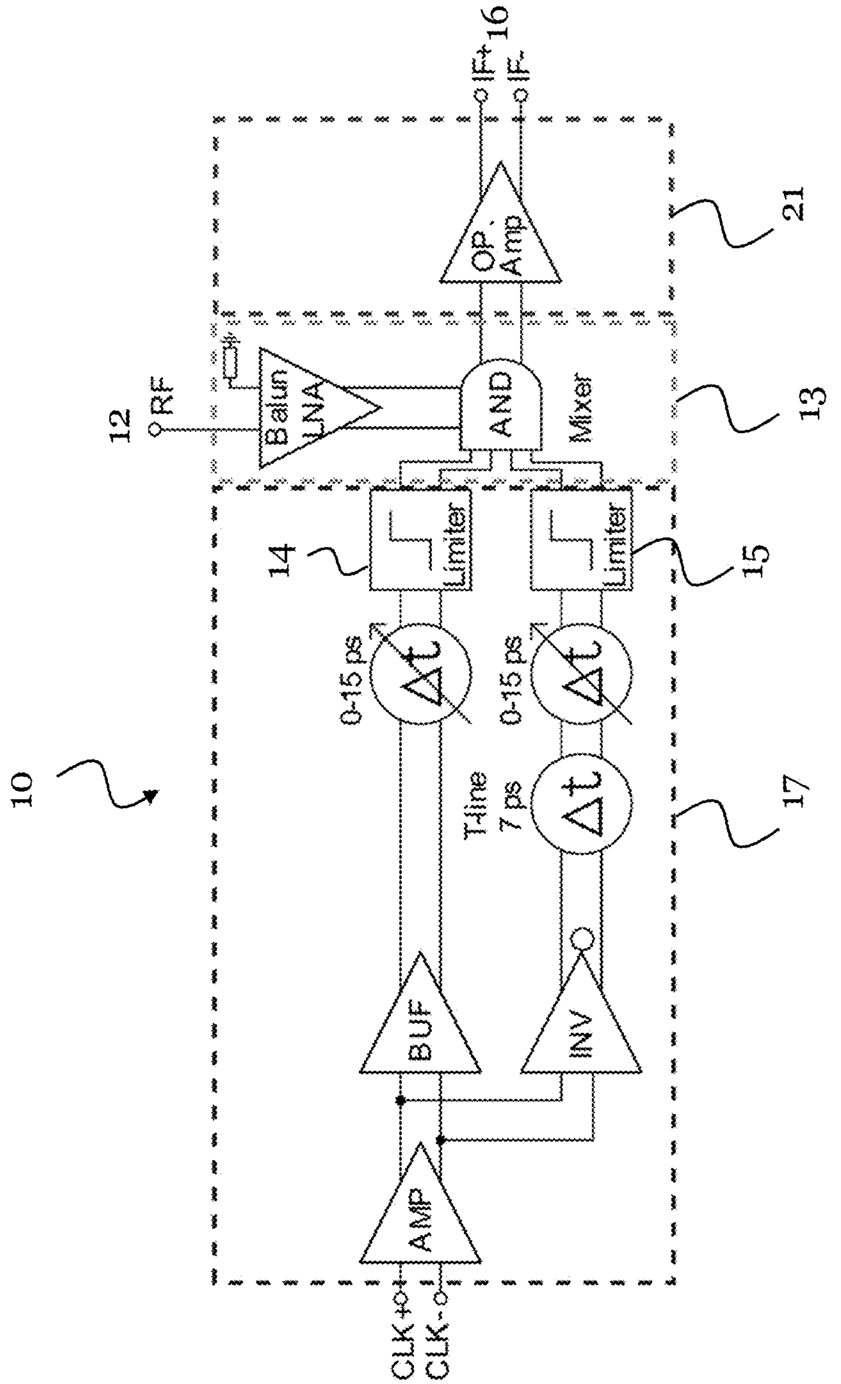
FIG. 2 shows an exemplary calibration device with integrated mixer and pulse generator according to this disclosure.

FIG. 2 shows an exemplary calibration device 10, which comprises the mixer 13 specifically referred to as an "AND mixer". The mixing of the RF signal 12 with the first LO signal 14 and the second LO signal 15 comprises a logical AND combination by the mixer 13 of the RF signal 12, the first LO signal 14, and the second LO signal 15. This also comprises logical AND combination of the first LO signal 14 and the second LO signal 15. The mixer 13 may process the signals directly by circuitry forming an AND-Gate to perform the AND combination.

FIG. 2 also shows that in the calibration device 10 the pulse generator 17, which is configured to generate the first LO signal 14 and the second LO signal 15 and to provide the first and second LO signal 14, 15 to the mixer 13, may be integrated with the mixer 13. Notably, the shown pulse generator 17 is an example, and various kinds of pulse generators 17 may be used in the calibration device 10. As shown, the pulse generator 17 and the mixer 13 may be integrated, for instance, on the same board or in the same chip.

Figure 3:
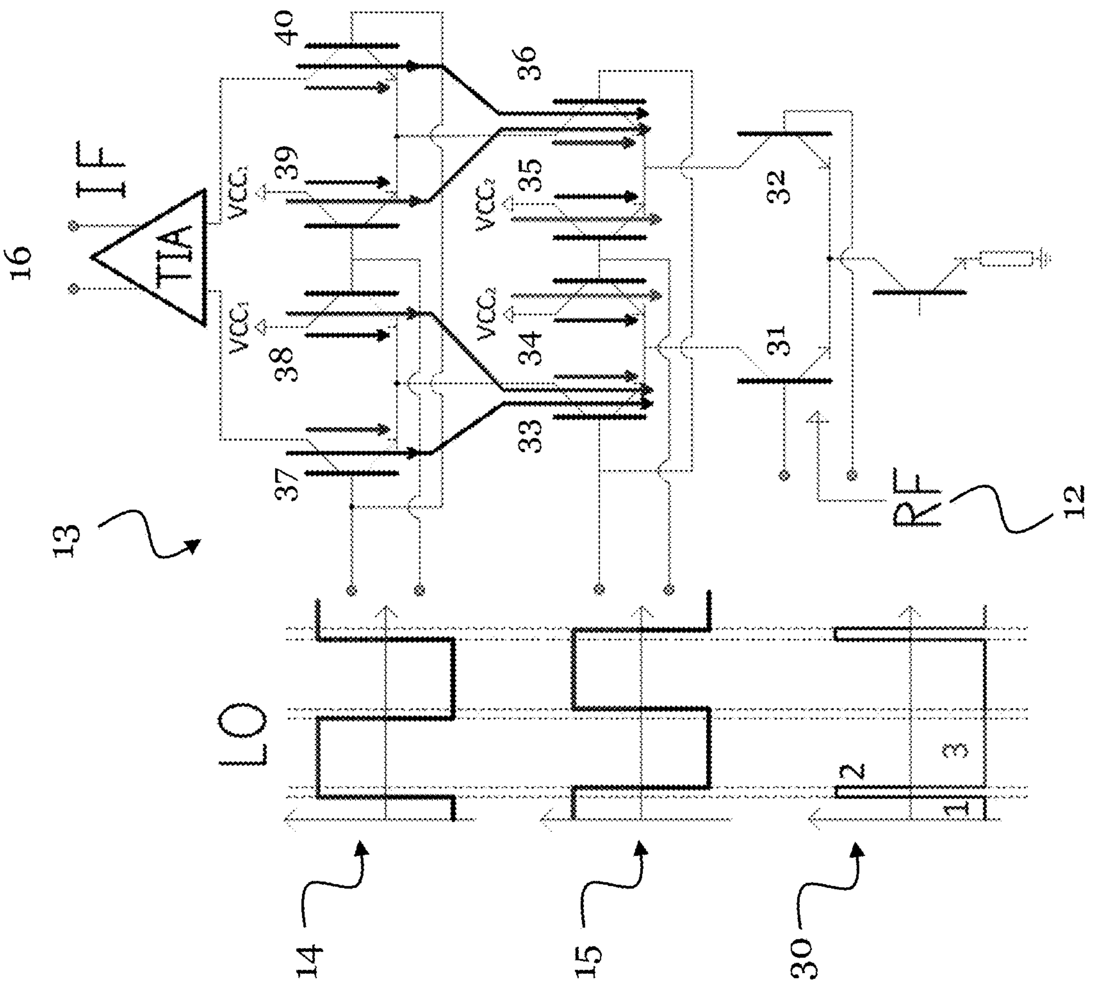
FIG. 3 shows a first exemplary mixer of a calibration device according to this disclosure.

The LO signals 14 and 15 may depend on each other, i.e., they may be generated by the same clock signal (CLK) of the pulse generator 17, and one may be derived from the other. For instance, the LO signals may be delayed inverses of each other. For example, the second LO signal 15 may be a negative and time-delayed copy of the first LO signal 14. This is illustrated in FIG. 3, which also shows that the AND combination of the first LO signal 14 and the second LO signal 15 results in a comb signal 30. The mixer 13 may effectively mix this comb signal 30 with the RF signal 12.

FIG. 2 shows further that the calibration device 10 may also comprise an amplifier 21, which may be also integrated with the mixer 13 and the pulse generator 17, and may amplify the IF signal 16 provided by the mixer 13. Other components, which are explained later, may additionally be integrated on the same board or chip.

The mixer 13 may generally be based on a Gilbert cell mixer architecture, but with modifications. The mixer 13 may have multiple stages, each stage comprising multiple transistors. Exemplary implementations are described below.

FIG. 3 shows in this respect a first exemplary implementation of the mixer 13. The mixer 13 of this example is composed of a first stage of transistors 31, 32 adapted to receive the RF signal 12 as an input, a second stage of transistors 33-36 connected to the first stage and adapted to receive the second LO signal 15 as an input, and a third stage of transistors 37-40 connected to the second stage and adapted to receive the first LO signal 14 as an input.

In the example, the first stage comprises a first transistor pair 31, 32, which is connected to a current source, wherein the first transistor pair 31, 32 is controlled by the RF signal 12 and is configured to provide a modulated current, which is modulated by the RF signal 12, to the second stage. As shown, the first transistor pair 31, 32 comprises a first transistor 31 and a second transistor 32, wherein opposite phases of the RF signal 12 are connected to control terminals of the first transistor 31 and the second transistor 32, respectively. Further, the input terminals of the first transistor 31 and the second transistor 32 are connected to each other and to the current source. The output terminals of the first transistor 31 and the second transistor 32 are connected to the second stage.

The second stage comprises a second transistor pair 33, 34 and a third transistor pair 35, 36, which are each connected to the first transistor pair 31, 32 and are each controlled by the second LO signal 15. The second transistor pair 33, 34 comprises a third transistor 33 and a fourth transistor 34, which are connected to each other by their input terminals. Opposite phases of the second LO signal 15 are connected to the control terminals of the third transistor 33 and the fourth transistor 34, respectively. The third transistor pair 35, 36 comprises a fifth transistor 35 and a sixth transistor 36, which are connected to each other by their input terminals. Opposite phases of the second LO signal 15 are connected to control terminals of the fifth transistor 35 and the sixth transistor 36, respectively. As shown, the input terminals of the third, fourth, fifth, and sixth transistor 33-36 are all connected to the first stage. In particular, the input terminals of the third transistor 33 and the fourth transistor 34 are connected to the output terminal of the first transistor 31, and the input terminals of the fifth transistor 35 and the sixth transistor 36 are connected to the output terminal of the second transistor 32. The output terminals of the third transistor 33 and the sixth transistor 36 are connected to the third stage. The output terminals of the fourth transistor 34 and the fifth transistor 35 are connected to a first supply voltage $VCC_2$.

The third stage comprises a fourth transistor pair 37, 38 and a fifth transistor pair 39, 40, which are connected to the second transistor pair 33, 34 and the third transistor pair 35, 36 of the second stage, respectively. The fourth transistor pair 37, 38 comprises a seventh transistor 37 and an eighth transistor 38, which are connected to each other by their input terminals. Opposite phases of the first LO signal 14 are connected to control terminals of the seventh transistor 37 and the eighth transistor 38, respectively. The fifth transistor pair 39, 40 comprises a ninth transistor 39 and the tenth transistor 40, which are connected to each other by their input terminals. Opposite phases of the first LO signal 14 are connected to the control terminals of the ninth transistor 39 and the tenth transistor 40, respectively. The input terminals of the seventh, eighth, ninth, and tenth transistor 37-40 are all connected to the second stage. In particular, the input terminals of the seventh transistor 37 and the eighth transistor 38 are connected to the output terminal of the third transistor 33. The input terminals of the ninth transistor 39 and the tenth transistor 40 are connected to the output terminal of the sixth transistor 36. The output terminals of the seventh transistor 37 and the tenth transistor 40 are connected to the output of the mixer 13. The output terminals of the eighth transistor 38 and the ninth transistor 39 are connected to a second supply voltage $VCC_1$.

Together, the second and the third stage of the mixer 13 are configured to mix the modulated current, which is provided by the first stage, with the second LO signal 15 and the first LO signal 14—which is equivalent to mixing the RF signal 12 with the AND combination of the first LO signal 14 and the second LO signal 15, i.e., the comb signal 30—thereby providing a pulse-modulated current as the IF signal 16 to the output of the mixer 13.

The connections of the transistors 34, 35, 38, and 39 to the respective supply voltages $VCC_1$ and $VCC_2$ may lead to a significant reduction of the RF-to-IF leakage in the mixer 13, and to a lower power consumption.

Figure 4:
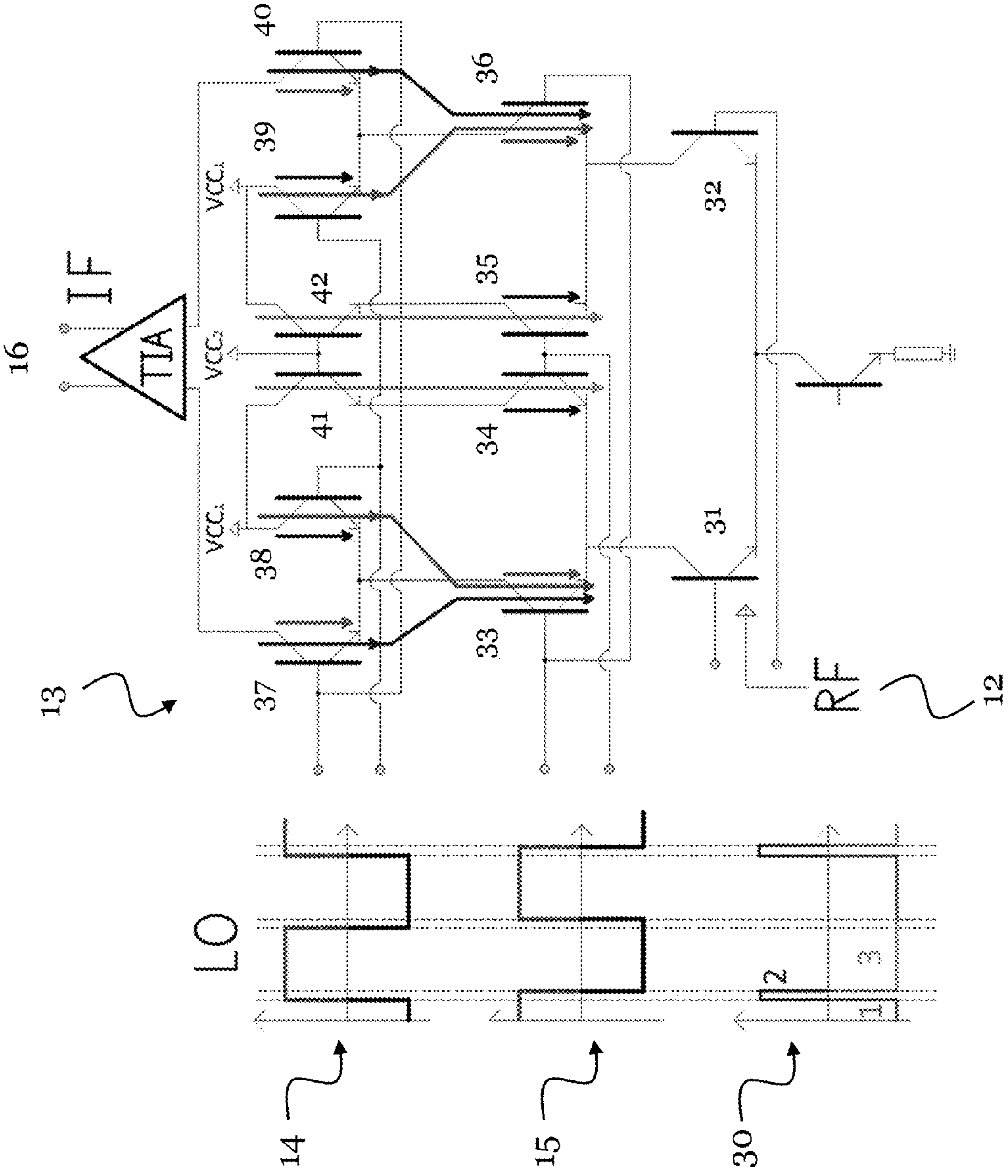
FIG. 4 shows a second exemplary mixer of a calibration device according to this disclosure

Notably the arrows indicated in FIG. 3 and FIG. 4, respectively, show current flows, which correspond to different switching states of the transistors in the second and third stage switched by the respective LO signals 15, 14 provided by the pulse generator 17.

FIG. 4 shows a second exemplary implementation of the mixer 13, which is in large parts similar to the first exemplary implementation shown in FIG. 3. Same elements in FIG. 3 and FIG. 4 are labelled with the same reference signs and are not repeatedly described.

In this example, the third stage further comprises a sixth transistor pair 41, 42 comprising an eleventh transistor 41 and a twelfth transistor 42, which are connected to each other by their control terminals. The control terminals of the eleventh transistor 41 and the twelfth transistor 42 are further connected to the first supply voltage $VCC_2$. The output terminals of the eleventh transistor 41 and the twelfth transistor 42 are connected to the second supply voltage $VCC_1$ and respectively to the output terminals of the eight transistor 38 and the ninth transistor 39 of the third stage. The input terminals of the eleventh transistor 41 and the twelfth transistor 42 are connected to the output terminals of the fourth transistor 34 and the fifth transistor 35, respectively.

The temperature differences may be minimized between the different transistors during operation of the mixer 13, due to an introduced asymmetry of the current flows indicated by the arrows. For example, the third transistor 33 and the fourth transistor 34 may have an operating temperature of 88° C. and 99° C., respectively, and the seventh transistor 37 and the eighth transistor 38 may have an operating temperature of 79° C. each during mixing the RF signal 12 with the LO signals 14, 15. The other transistors may behave similarly. Thus, an overall maximum temperature difference between transistors of different stages and pairs is 20° C. or lower. A difference of transistors of the same pair is limited to even 11° C. or lower.

In this disclosure, especially in the exemplary implementations of the mixer 13 shown in FIGS. 3 and 4, each transistor 31-40 may be a bipolar transistor or a FET. If a transistor is a bipolar transistor, then its input terminal is an emitter, its output terminal is a collector, and its control terminal is a base. If a transistor is a FET, its input terminal is a source, its output terminal is a drain, and its control terminal is a gate. Notably, input and output terminals of the transistors could be swapped and still work according to the solutions of this disclosure.

Figure 5:
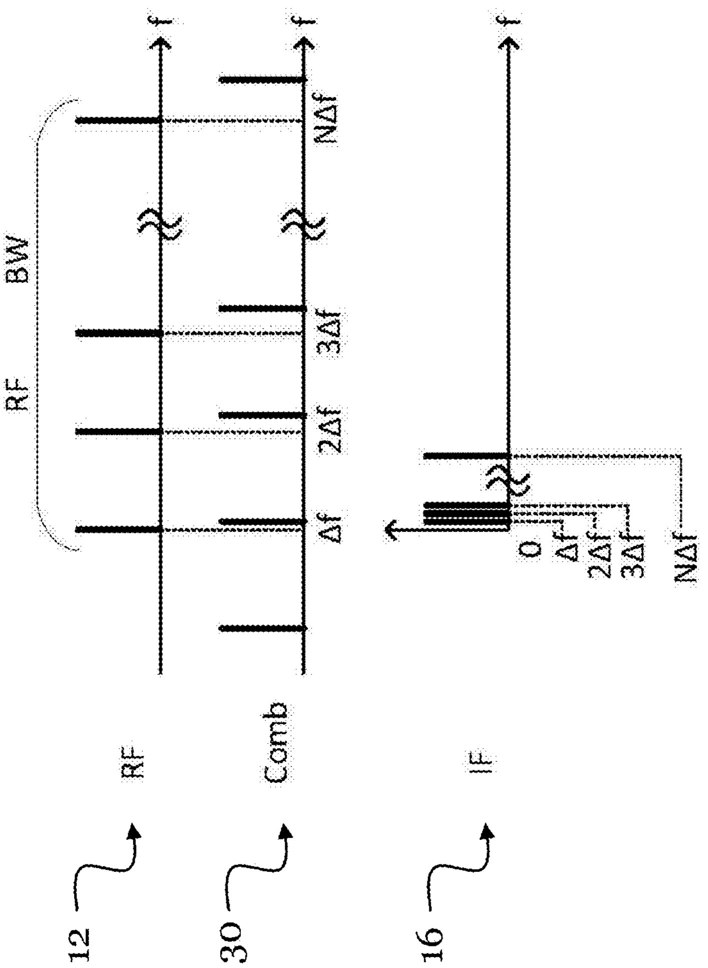
FIG. 5 shows spectrums of the RF signal, of a comb signal that results from an AND combination of the first LO signal and the second LO signal, and of the IF signal.

FIG. 5 shows a result of mixing the LO signals 15, 14 and the RF signal 12 in the mixer 13. FIG. 5 shows the RF signal 12 and the comb signal 30, which is the logical AND combination of the first LO signal 15 and the second LO signal 14. That is, the first LO signal 14 and the second LO signal 14 are selected such that the logical AND combination results in the comb signal 30. As shown in FIGS. 3 and 4, the second LO signal 15 may be the negative and time-delayed copy of the first LO signal 14.

The two LO signals 14 and 15 are particularly selected such that the comb signal 30 has equidistant frequency lines and has a higher bandwidth than the RF signal 12. The RF signal 12 may have an exemplary bandwidth of 8 GHz, while the comb signal 30 may have an exemplary bandwidth of 50 GHz. Each of the equidistant discrete frequency lines of the comb signal 30 is different to the discrete frequency lines of the RF signal 12 with regard to frequency. Generally, a discrete frequency line may correspond to a Dirac delta function, namely the respective narrow peaks associated with the Dirac delta functions.

The spectrum of the IF signal 16, which results from the mixing by the mixer 13, is also shown in FIG. 5. In this regard, FIG. 5 reveals that the wider bandwidth RF signal 12 provided by the signal generator 11 is fully represented by the IF signal 16 with the lower bandwidth. The lower bandwidth of the IF signal 16 can be processed at once without segmentation, while containing all the information in the broadband RF signal 12. The entire IF signal 12 and, therefore, the information encompassed by the entire RF signal 12 can be measured in a non-segmented manner, because the spectrum of the IF signal 16 is compressed in comparison to the RF signal 12, due to the mixing with the first LO signal 14 and the second LO signal 15. A compression ratio may be set depending on the frequencies of the RF signal 12 and the LO signals 14, 15 used.

In an example, the calibration device 10 comprises a user interface, via which a user is enabled to make settings of the calibration device 10. For instance, the user can be enabled to select the compression ratio or the frequencies of the signals. For instance, a frequency spacing of the discrete frequency lines of the comb signal 30 is selectable. The user may also select a certain operation mode of the calibration device 10 for performing the respective method of measuring the RF signal generator 11.

As shown in FIG. 5, each discrete frequency line of the RF signal 12 is associated with a corresponding discrete frequency line of the comb signal 30, thereby forming pairs. Each of the pairs has an internal frequency spacing Δf, 2Δf, 3Δf and so on, namely a frequency spacing between the discrete frequency lines of the RF signal 12 with respect to the corresponding discrete frequency line of the comb signal 30. The respective internal frequency spacing is illustrated due to the respective projection of the RF signal 12 within the spectrum of the comb signal 30 indicated by the dashed lines in FIG. 5. It becomes clear that the internal frequency spacing of each pair is different, as the internal frequency spacings increase linearly with increasing frequency, namely starting from Δf to NΔf.

Figure 6:
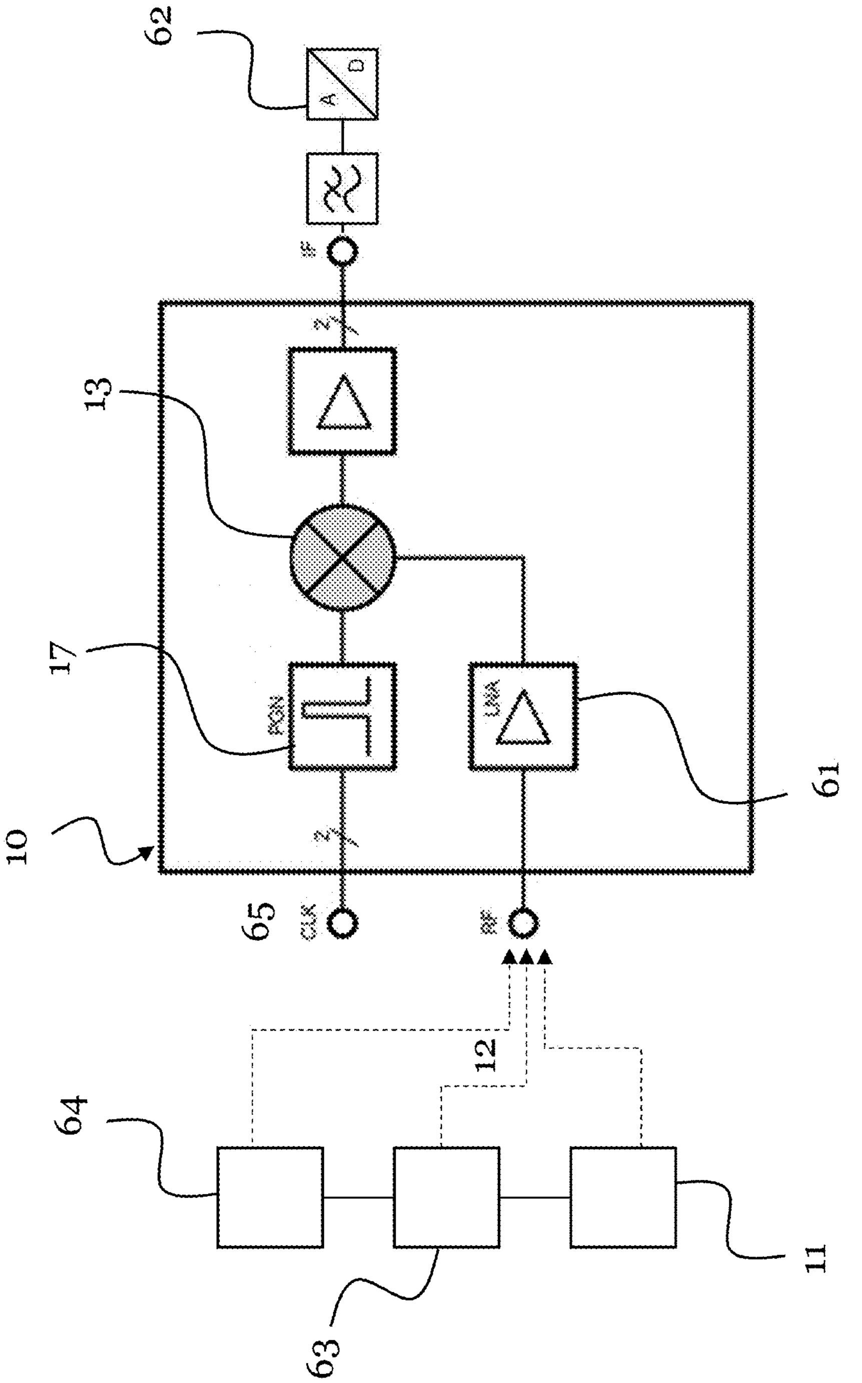
FIG. 6 shows a calibration setup according to this disclosure, which includes the calibration device and the signal generator.

FIG. 6 shows a calibration setup according to this disclosure, wherein the calibration setup comprises the calibration device 10 and the RF signal generator 11, which is configured to output the RF signal 12 for the purpose of calibration. The RF (calibration) signal 12 may be established by the RF signal generator 11 based on a comb signal, for instance, in a calibration mode of the RF signal generator 11. For instance, the RF signal generator 11 may provide this RF signal 12 to a DUT 64, for example, via a RF device 63. The calibration device 10 receives the output RF signal 12 of the RF signal generator 11, wherein the RF signal 12 may be tapped at the RF device 63. Alternatively, the RF signal 12 may be tapped at an output connecter of the RF signal generator 11 directly. Alternatively, the RF signal 12 may be tapped at an input connecter of the DUT 64 that is connected with the signal generator 11, for instance via a cable or line. These different tap positions are indicated in FIG. 6 by dashed lines accordingly.

FIG. 6 also shows that the calibration device 10 may comprise a LNA 61 configured to amplify the RF signal 12 before providing it to the mixer 13. The LNA 61 may be adjustable, in order to adjust a signal strength of the RF signal 12 to the LO signals 15, 14. The LO signals 15, 14 are produced by the pulse generator 17, which may be operated based on a first clock signal 65 (CLK) received by the calibration device 10. The calibration device 10 may also comprise an amplifier to amplify the IF signal 16 provided by the mixer 13.

The calibration device 10 may also comprise or be connected to a processing unit, which may comprise an ADC 62. The ADC 62 may digitize the IF signal 16. The ADC 62 may have a low bandwidth. Generally, simplified components, like synthesizers and ADCs can be used in the processing unit, due to the reduced bandwidth of the IF signal 16, thereby reducing the overall costs of the calibration device 10 and calibration setup.

The calibration device 10 may also comprise an internal processor or a controller (not shown), which is configured to control the pulse generator 17 and/or the LNA 61, and/or the mixer 13.

The processor or processing unit may comprise circuitry configured to perform, conduct or initiate the various operations of the calibration device or processing unit described herein. The processor or processing unit may comprise hardware and/or may be controlled by software. The hardware may comprise analog circuitry or digital circuitry, or both analog and digital circuitry. The digital circuitry may comprise components such as application-specific integrated circuits (ASICs), FPGAs, digital signal processors (DSPs), or multi-purpose processors. The processor or processing unit may further comprise memory circuitry, which stores one or more instruction(s) that can be executed, in particular under control of the software. For instance, the memory circuitry may comprise a non-transitory storage medium storing executable software code which, when executed, causes the various operations of the calibration device 10 or processing unit described herein.

Figure 7:
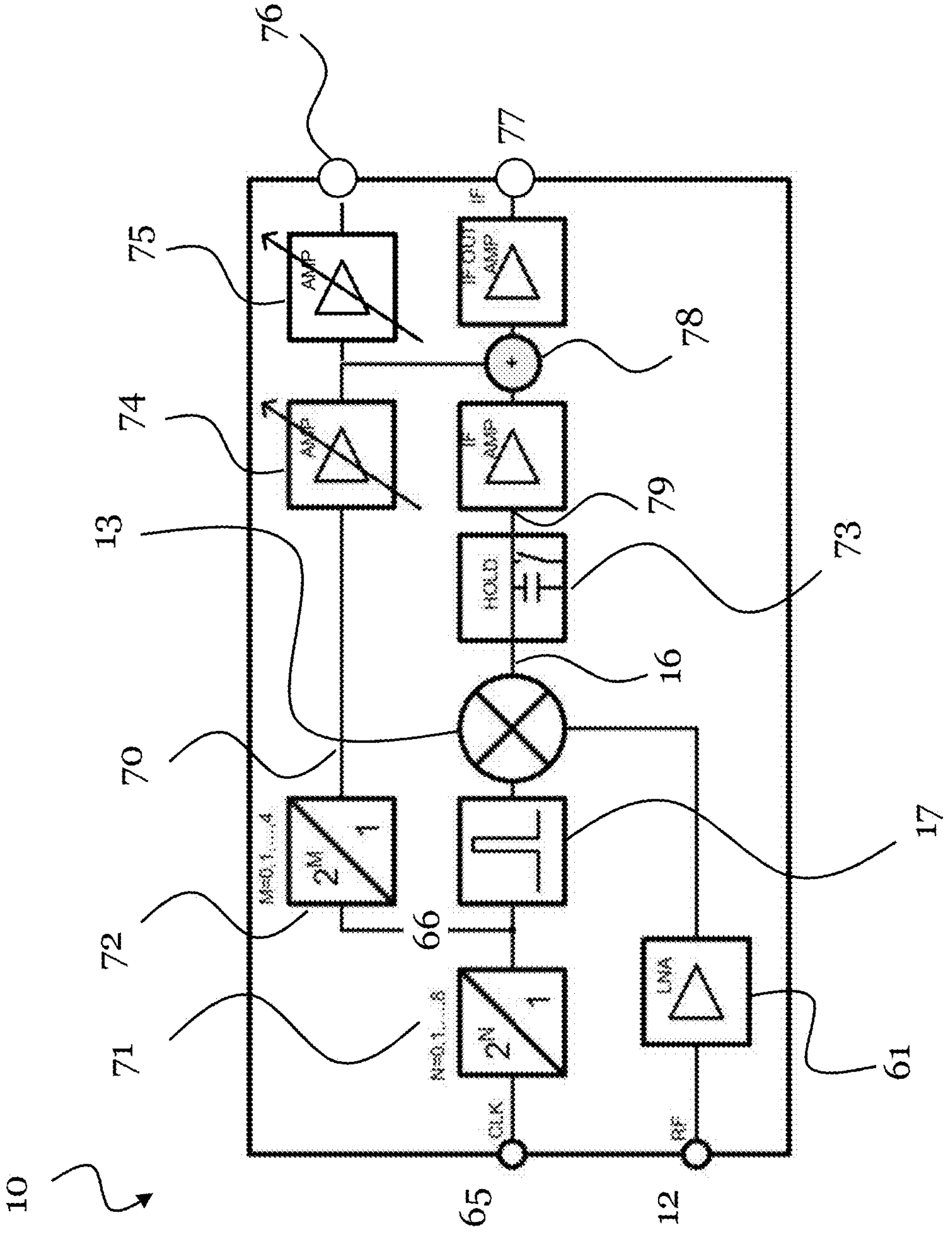
FIG. 7 shows additional, optional components of an exemplary calibration device according to this disclosure.

FIG. 7 shows an exemplary calibration device 10 according to this disclosure, which includes further optional components. Same elements in FIG. 7 and the previous figures are labelled with the same reference signs, and may not be described again to avoid redundancy.

For example, the calibration device 10 may comprise a first frequency divider 71 (e.g., a $2^N$ divider with N=0 to 8) and a second frequency divider 72 (e.g., a $2^M$ divider with M=0 to 4). The first frequency divider 71 is configured to receive the first clock signal 65 (CLK) input to the calibration device 10, and to convert the first clock signal 65 into a second clock signal 66. This second clock signal 66 is provided to the pulse generator 17, which is configured to generate the first LO signal 14 and the second LO signal 15 based on the second clock signal 66.

The first frequency divider 71 is further configured to provide the second clock signal 66 to the second frequency divider 72, and the second frequency divider 72 is configured to convert the second clock signal 66 into a third clock signal 70. This third clock signal 70 may be amplified by an amplifier 74 and an amplifier 75, and may be output by a clock output 76 from the calibration device 10. The third clock signal 70 may be further added to the IF signal 16. For example, the third clock signal 70 may be added by an adder 78 to the IF signal 16 that is provided by the mixer 13 (which may optionally be amplified before the adding), wherein the adding produces a modified IF signal 77.

The integrated frequency dividers 71, 72 may be used for a pilot tone generation, wherein the third clock signal 73 (including pulses or tones) may be used as pilot tones that are added to the IF signal 16 (which also include pulses or tones). The modified IF signal 77 may then be sampled, for instance, in the processing unit including the ADC 62, in order to reconstruct a phase of the second clock signal 66 provided by the first frequency divider 71, which is enabled by the added pilot tones.

The level or amplitude of the pilot tones (i.e., the tones of the third clock signal 70) may be adjustable, which may be achieved with the adjustable amplifier 74. This enables signal level matching to the (modified) IF signal 16 and/or to the ADC dynamic range. The divider ratios of the first frequency divider 71 and/or the second frequency divider 72 may be settable within a certain range. For example, the variable divider ratios may be used for pilot tone generation at different and/or multiple frequencies. Phase inaccuracies of the frequency dividers 71, 72 may be cancelled out, which may lead to a shorter setup and/or measurement time. The above-described enables the detection of absolute phase (not possible in conventional solutions without additional circuitry).

The calibration device 10 may further comprise a hold gate 73 connected to the output of the mixer 13. The hold gate 73 is configured to convert a current pulse of the IF signal 16 provided by the mixer 13 to a voltage, and to hold the voltage until the next current pulse of the IF signal 16 is output by the mixer 13. Thereby, the hold gate 73 may be configured to output an integrated IF signal 79, for example, a modulated voltage signal. As shown in FIG. 7, if the calibration device 10 includes the hold gate 73, the third clock signal 70 may be added by the adder 78 to the integrated IF signal 79 provided by the hold gate 73 (which could be amplified by an amplifier 79 before the adding), wherein the adding produces the modified IF signal 77.

Figure 8A:
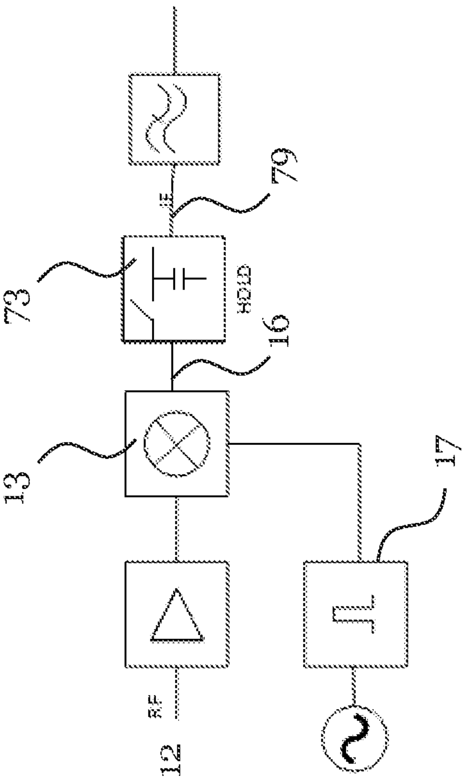
FIGS. 8A and 8B show a hold gate of an exemplary calibration device according to this disclosure, and its effect on the IF signal output by the mixer.

The advantages of the hold gate 73 are shown in FIG. 8. As can be seen in FIG. 8(*a*), the hold gate 73 may comprise a capacitor, which may be connected to the output of the mixer 13 and a supply voltage, respectively. Further, the hold gate 73 may comprise a switch connected in parallel to the capacitor. The switch may be controlled by the second clock signal 66.

In a conventional mixer, a current-voltage conversion is done with a resistor or a transimpedance amplifier, wherein the useful signal is very small to be further processed. The hold gate 73 (or hold circuit) of this disclosure provides an improvement in this respect, as it stores the current pulses from the mixer 13, i.e., of the IF signal 15 in the form of voltage, and then holds them, and then before the next current pulse comes, clears the stored voltage. This may correspond to an "integrate and dump" circuit. This may achieve a signal energy increase in the amount of the ratio of the hold time to the current pulse width. A simple way to realize this is to shift the reset clock for resetting the stored voltage by 90° to the second clock signal 66 that generates the pulses of the LO signals 15, 14.

Figure 8B:
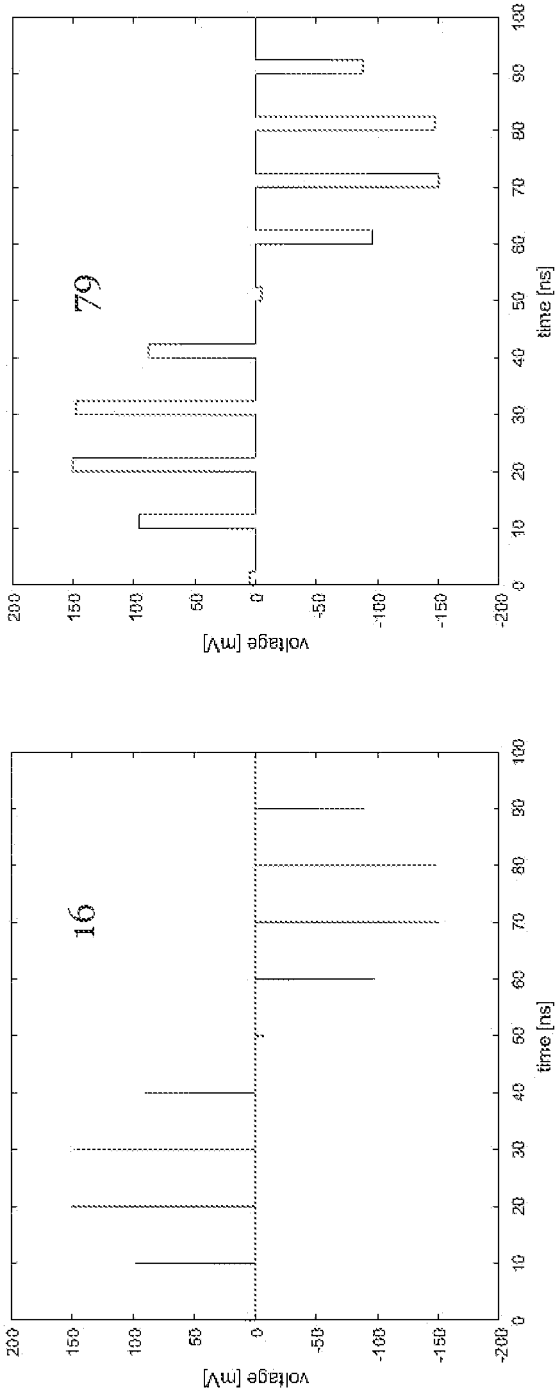

FIG. 8*b* shows signal voltages of the IF signal 16 (without hold gate 73) and the integrated IF signal 79 (with the hold gate 73), respectively. A clear gain can be observed.

Figure 9:
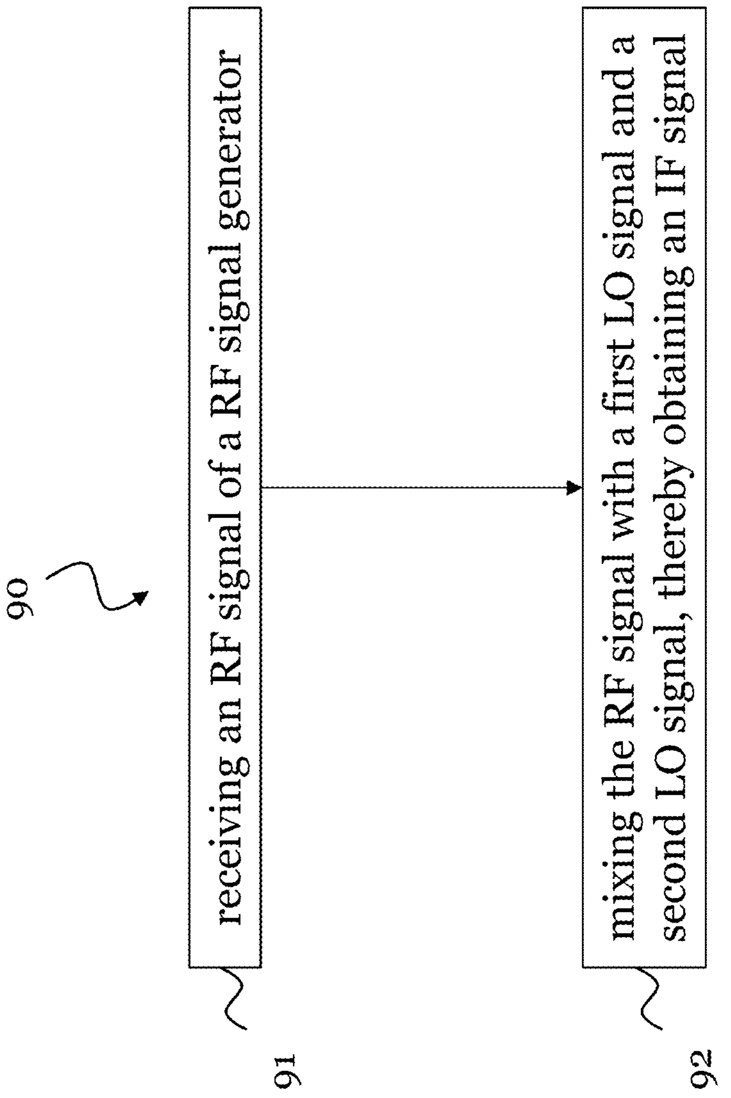
FIG. 9 shows a method according to this disclosure for measuring an RF signal generator.

FIG. 9 shows a method 90 according to this disclosure for measuring a RF signal generator 11. The method 90 may be performed by the calibration device 10, respectively, its mixer 13. The method 90 comprises a step 91 of receiving the RF signal 12 of the RF signal generator 11, and a step 92 of mixing the RF signal 12 with the first LO signal 14 and the second LO signal 15, wherein the IF signal 16 having the smaller bandwidth than the RF signal 12 is obtained. As already mentioned above, the RF signal 12 in this disclosure is generated and output by the RF signal generator 11 for the purpose of calibration, and may thus be referred to as a RF calibration signal. The RF signal 12 may be a MCCW signal or the like, as explained before.

In the claims as well as in the description of this disclosure, the word "comprising" does not exclude other elements or steps and the indefinite article "a" or "an" does not exclude a plurality. A single element may fulfill the functions of several entities or items recited in the claims. The mere fact that certain measures are recited in the mutual different dependent claims does not indicate that a combination of these measures cannot be used in an advantageous implementation.

The present disclosure may reference quantities and numbers. Unless specifically stated, such quantities and numbers are not to be considered restrictive, but exemplary of the possible quantities or numbers associated with the present disclosure. Also in this regard, the present disclosure may use the term "plurality" to reference a quantity or number. In this regard, the term "plurality" is meant to be any number that is more than one.

The principles, representative embodiments, and modes of operation of the present disclosure have been described in the foregoing description. However, aspects of the present disclosure are not to be construed as limited to the particular embodiments disclosed. Further, the embodiments described herein are to be regarded as illustrative rather than restrictive.

The invention claimed is:

1. A calibration device for measuring a radio frequency, RF, signal generator, the calibration device comprising:
- an input configured to receive an RF signal of the RF signal generator, wherein the RF signal has discrete frequency lines;
- a pulse generator configured to generate a first local oscillator, LO, signal and a second LO signal; and
- a mixer configured to mix the RF signal with the first LO signal and the second LO signal, thereby obtaining an intermediate frequency, IF, signal that has discrete frequency lines and a smaller bandwidth than the RF signal,
- wherein the mixing of the RF signal with the first LO signal and the second LO signal comprises a logical AND combination of the RF signal, the first LO signal, and the second LO signal.

2. The calibration device according to claim 1, wherein the second LO signal is a negative and time-delayed copy of the first LO signal.

3. The calibration device according to claim 1,
- wherein the first LO signal and the second LO signal are selected such that a logical AND combination of the first LO signal and the second LO signal results in a comb signal;
- wherein the comb signal has a higher bandwidth than the RF signal;
- wherein the comb signal has equidistant discrete frequency lines; and
- wherein each of the equidistant discrete frequency lines of the comb signal is different to the discrete frequency lines of the RF signal with regard to frequency.

4. The calibration device according to claim 1, wherein the pulse generator and the mixer are integrated.

5. The calibration device according to claim 1, wherein the mixer comprises:
- a first stage of transistors adapted to receive the RF signal as input;

a second stage of transistors connected to the first stage and adapted to receive the second LO signal as input; and a third stage of transistors connected to the second stage and adapted to receive the first LO signal as input.

6. The calibration device according to claim 5, wherein:

the first stage comprises a first transistor pair connected to a current source; and the first transistor pair is controlled by the RF signal and is configured to provide a modulated current, which is modulated by the RF signal, to the second stage.

7. The calibration device according to claim 6, wherein:

the second stage comprises a second transistor pair and a third transistor pair, which are each connected to the first transistor pair and are controlled by the second LO signal;

the third stage comprises a fourth transistor pair and a fifth transistor pair, which are connected to the second transistor pair and the third transistor pair, respectively, and are controlled by the first LO signal; and the second and third stage are configured to mix the modulated current, which is provided by the first stage, with the second LO signal and the first LO signal, thereby providing a pulse-modulated current as the IF signal to an output of the mixer.

8. The calibration device according to claim 7, wherein:

the second transistor pair comprises a third transistor and a fourth transistor connected by their input terminals, wherein opposite phases of the second LO signal are connected to control terminals of the third transistor and the fourth transistor, respectively; and the third transistor pair comprises a fifth transistor and a sixth transistor connected by their input terminals, wherein opposite phases of the second LO signal are connected to control terminals of the fifth transistor and the sixth transistor, respectively wherein the input terminals of the third, fourth, fifth, and sixth transistor are connected to the first stage;

wherein output terminals of the third transistor and the sixth transistor are connected to the third stage; and wherein output terminals of the fourth transistor and the fifth transistor are connected to a first supply voltage.

9. The calibration device according to claim 8, wherein:

the third stage comprises a sixth transistor pair comprising an eleventh transistor and a twelfth transistor connected by their control terminals;

wherein the control terminals of the eleventh transistor and the twelfth transistor are connected to the first supply voltage;

wherein output terminals of the eleventh transistor and the twelfth transistor are connected to the second supply voltage; and wherein input terminals of the eleventh transistor and the twelfth transistor are connected to the output terminals of the fourth transistor and the fifth transistor, respectively.

10. The calibration device according to claim 7, wherein:

the fourth transistor pair comprises a seventh transistor and an eighth transistor connected by their input terminals, wherein opposite phases of the first LO signal are connected to control terminals of the seventh transistor and the eighth transistor, respectively; and the fifth transistor pair comprises a ninth transistor and a tenth transistor connected by their input terminals, wherein opposite phases of the first LO signal are connected to control terminals of the ninth transistor and the tenth transistor, respectively wherein input terminals of the seventh, eighth, ninth, and tenth transistor are connected to the second stage;

wherein output terminals of the seventh transistor and the tenth transistor are connected to the output of the mixer; and wherein output terminals of the eighth transistor and the ninth transistor are connected to a second supply voltage.

11. The calibration device according to claim 6, wherein:

the first transistor pair comprises a first transistor and a second transistor, wherein opposite phases of the RF signal are connected to control terminals of the first transistor and the second transistor, respectively;

wherein input terminals of the first transistor and the second transistor are connected to each other and to the current source; and wherein output terminals of the first transistor and the second transistor are connected to the second stage.

12. The calibration device according to claim 1, further comprising:

a hold gate connected to an output of the mixer;

wherein the hold gate is configured to convert a current pulse of the IF signal provided by the mixer to a voltage and to hold the voltage until the next current pulse of the IF signal is output by the mixer, thereby outputting a modulated voltage as an integrated IF signal.

13. The calibration device according to claim 12, further comprising:

a first frequency divider configured to receive a first clock signal, to convert the first clock signal into a second clock signal, and to provide the second clock signal to the pulse generator;

wherein the pulse generator is configured to generate the first LO signal and the second LO signal based on the second clock signal, the hold gate comprises a capacitor connected to the output of the mixer and a supply voltage, respectively, and comprises a switch connected in parallel to the capacitor; and the switch is controlled by the second clock signal.

14. The calibration device according to claim 1, further comprising a low noise amplifier configured to amplify the RF signal before providing it to the mixer.

15. The calibration device according to claim 1, further comprising:

a first frequency divider configured to receive a first clock signal, to convert the first clock signal into a second clock signal, and to provide the second clock signal to the pulse generator;

wherein the pulse generator is configured to generate the first LO signal and the second LO signal based on the second clock signal.

16. The calibration device according to claim 15, further comprising:

a second frequency divider;

wherein the first frequency divider is further configured to provide the second clock signal to the second frequency divider;

wherein the second frequency divider is configured to convert the second clock signal into a third clock signal; and wherein the calibration device is further configured to add the third clock signal provided by the second frequency divider to the IF signal provided by the mixer or to an integrated IF signal provided by a hold gate, thereby obtaining a modified IF signal.

17. The calibration device according to claim 16, further configured to sample the modified IF signal to reconstruct a phase of the second clock signal provided by the first frequency divider.

18. The calibration device according to claim 16, further comprising a clock output configured to output the third clock signal provided by the second frequency divider.

19. A calibration setup comprising the calibration device according to claim 1 and the signal generator configured to output the RF signal to a device under test, DUT.

20. A method for measuring a radio frequency, RF, signal generator, the method comprising:

receiving an RF signal of the RF signal generator, wherein the RF signal has discrete frequency lines; and mixing the RF signal with a first local oscillator, LO, signal and a second LO signal, thereby obtaining an intermediate frequency, IF, signal that has discrete frequency lines and a smaller bandwidth than the RF signal, wherein the mixing of the RF signal with the first LO signal and the second LO signal comprises a logical AND combination of the RF signal, the first LO signal, and the second LO signal.

21. A non-transitory computer-readable storage medium storing instructions which, when executed by a processor, cause the processor to perform the method according to claim 20.

* * * * *